United States Patent
Yuan et al.

(10) Patent No.: US 7,277,315 B2
(45) Date of Patent: Oct. 2, 2007

(54) MULTIPLE POWER SUPPLIES FOR THE DRIVING CIRCUIT OF LOCAL WORD LINE DRIVER OF DRAM

(75) Inventors: Der-Min Yuan, Taipei County (TW); Jen Shou Hsu, Hsin-Chu (TW); Yao Yi Liu, Hsinchu (TW)

(73) Assignee: Etron Technology, Inc., Hsin-Chu (TW)

( * ) Notice: Subject to any disclaimer, the term of this patent is extended or adjusted under 35 U.S.C. 154(b) by 0 days.

(21) Appl. No.: 11/304,416

(22) Filed: Dec. 14, 2005

(65) Prior Publication Data

US 2007/0133317 A1    Jun. 14, 2007

(51) Int. Cl.
*G11C 11/24*    (2006.01)

(52) U.S. Cl. ............. 365/149; 365/189.11; 365/230.06

(58) Field of Classification Search ................ 365/149, 365/189.11, 230.06
See application file for complete search history.

(56) References Cited

U.S. PATENT DOCUMENTS

| | | | |
|---|---|---|---|
| 5,202,855 A | 4/1993 | Morton | |
| 5,557,580 A * | 9/1996 | Numaga et al. | 365/230.06 |
| 6,236,617 B1 | 5/2001 | Hsu et al. | |
| 6,747,904 B2 | 6/2004 | Chen | |
| 6,774,708 B2 * | 8/2004 | Matsui | 327/536 |
| 7,091,769 B2 * | 8/2006 | Kwon et al. | 327/535 |
| 2004/0207458 A1 * | 10/2004 | Origassa et al. | 327/535 |

* cited by examiner

*Primary Examiner*—Hoai V. Ho
(74) *Attorney, Agent, or Firm*—Saile Ackerman LLC; Stephen B. Ackerman

(57) ABSTRACT

Methods and circuits to reduce power consumption of DRAM local word-line drivers are disclosed. A first voltage converter provides a voltage VPP1, which is lower than the voltage VPP required to operate a word-line of a DRAM cell array. A voltage detector monitors the voltage level of the local word-line driver. Once the voltage level VPP1 is reached on the local word-linedriver switching means as e.g. tri-state drivers put the final VPP voltage on the word line. This VPP voltage is the output of a second voltage boost converter. Putting the voltage in two stages on the word-line reduces the overall power consumption. The voltage level VPP1 has to be carefully selected to find a compromised solution between current consumption and performance.

12 Claims, 4 Drawing Sheets

MULTIPLE POWER SUPPLIES FOR THE DRIVING CIRCUIT OF LOCAL WORD LINE DRIVER OF DRAM

BACKGROUND OF THE INVENTION

1. Field of the Invention

This invention relates generally to DRAM memories and relates more particularly to driving circuits of local word line drivers of DRAMs.

2. Description of the Prior Art

The optimization of the energy consumption of memory systems gets more and more important. Many modern computer applications are data-intensive and nowadays for ASICs and embedded systems the memory components contribute up to 90% of the energy consumption of the data processing system.

DRAM circuit designs require often that bit lines require power supply voltage level $V_{DD}$ while word-line drivers have to provide an output voltage $V_{PP}$ that has to be above the $V_{DD}$ voltage level. This is achieved by boosting the supply ($V_{DD}$) voltage level to a higher voltage than the voltage of the cell capacitor. The high level of $V_{PP}$ is necessary for DRAM array operation, but at the expense of a higher current consumption due to decreased pumping efficiency while $V_{DD}$ becoming lower.

There are various known patents dealing with the optimization of energy consumption of memory systems:

U.S. Pat. No. (6,236,617 to Hsu et al.) teaches a negative word-line DRAM array having n groups of m word-lines, in which one group is driven by a group decoder circuit (having a voltage swing between ground and a circuit high voltage (2 v)) and one driver circuit in each group is exposed to a boosted word-line high voltage (2.8 v) greater than the circuit high voltage, in which the word-line driver circuits have an output stage comprising a standard nfet in series with a high threshold voltage pfet, so that, during activation, the unselected driver circuits exposed to the boosted word-line high voltage have a very low leakage through the pfet, while the selected driver circuit has a high but tolerable leakage (2 .mu.A) because Vqs on the nfet is nearly at the nfet threshold. The net active power from the entire array is less than that of a conventional configuration due to the reduced voltage swing, while the number of transistors exposed to high voltage stress is reduced from 9 to 1 and the number of buffer nfets required to reduce voltage drop across an active nfet is reduced from 8 to 1.

U.S. Pat. No. (5,202,855 to Morton) discloses a DRAM containing both driver control logic and level shifting driver circuitry to generate a voltage boosted word-line signal. The driver control logic receives timing signals and row address information to provide timing control signals for the level-shifting driver. The level-shifting driver provides a voltage boosted word-line signal for a predetermined period of time in response to the timing control signals. Furthermore, the driver control logic provides control to the level shifting driver circuit to assure that transistors that drive the word-line signal are not damaged by voltage during a switching transition.

U.S. Pat. No. (6,747,904 to Chen) introduces a leakage control circuit and DRAM equipped therewith. The leakage control circuit includes a differential amplifier, a first voltage divider, a second voltage divider, MOS transistors, and a charge pump. The first voltage divider generates a first reference voltage. The second voltage divider generates a second reference voltage. The differential amplifier has a first input receiving the first reference voltage, a second input receiving the second reference voltage, and an output coupled to the input of the charge pump. MOS transistors have drains coupled to the first input of the differential amplifier, gates coupled to the output of the charge pump, and sources coupled to a ground potential.

SUMMARY OF THE INVENTION

A principal object of the present invention is to reduce the power consumption of local word-line DRAM drivers.

In accordance with the objects of this invention a method to reduce power consumption of a local DRAM word-line driver by building up in n stages a voltage VPP required has been achieved. The method invented comprises, first, (1) to provide n voltage boost converters, n switching means, a local word-line driver circuit, and (n−1) voltage detectors. The following steps of the method are (2) to monitor the voltage on said local word-line driver, and (3) to use the output of a first of said voltage boost converters to build-up on a local word-line driver a first intermediate voltage VPP1 being smaller than the boosted voltage VPP required to operate the word-line of a DRAM memory cell array until said intermediate voltage VPP1 is reached. The last two steps of the method are (4) to use the output of a next of said n voltage boost converters to build-up on a local word-line driver a next voltage level assigned to the boost converter in operation, wherein said voltage is higher than the previous voltage level until said voltage level assigned is reached, and (5) to check if n-th voltage booster converter is in use and if negative, go to step (4), otherwise go to end;

In accordance with the objects of this invention a circuit to provide a boosted voltage for a local word-line driver of a DRAM cell array has been achieved. The circuit invented comprises, first, a word-line of DRAM cell array and two voltage boost converters being connected to a first switching means, wherein a first converter provides a voltage level VPP required to operate said word-line of a DRAM cell array and a second boost converter provides a voltage level VPP1 which is lower than voltage level VPP. Furthermore the circuit invented comprises a control circuit having inputs and outputs wherein its inputs are a signal to enable said local word-line driver and a signal from a voltage detector indicating if the voltage level of said local word-line driver has reached said VPP1 voltage level and its output are two exclusive signals enabling said first switching means to put either said VPP1 voltage or said VPP voltage on said word-line, said voltage detector monitoring the voltage level of said local word-line driver and indicating to said control circuit when VPP1 voltage level is reached, and said first switching means which is controlled by said control circuit putting either said VPP voltage or said VPP1 voltage on said local word-line driver. Finally the circuit comprises a second switching used to disable said local word-line driver by connecting the local word-line driver to a ground voltage level.

BRIEF DESCRIPTION OF THE DRAWINGS

In the accompanying drawings forming a material part of this description, there is shown.

DESCRIPTION OF THE PREFERRED EMBODIMENTS

The preferred embodiments disclose methods and circuits to reduce the power consumption of the driving circuit of local word-line drivers of DRAM memories.

Figure 1:
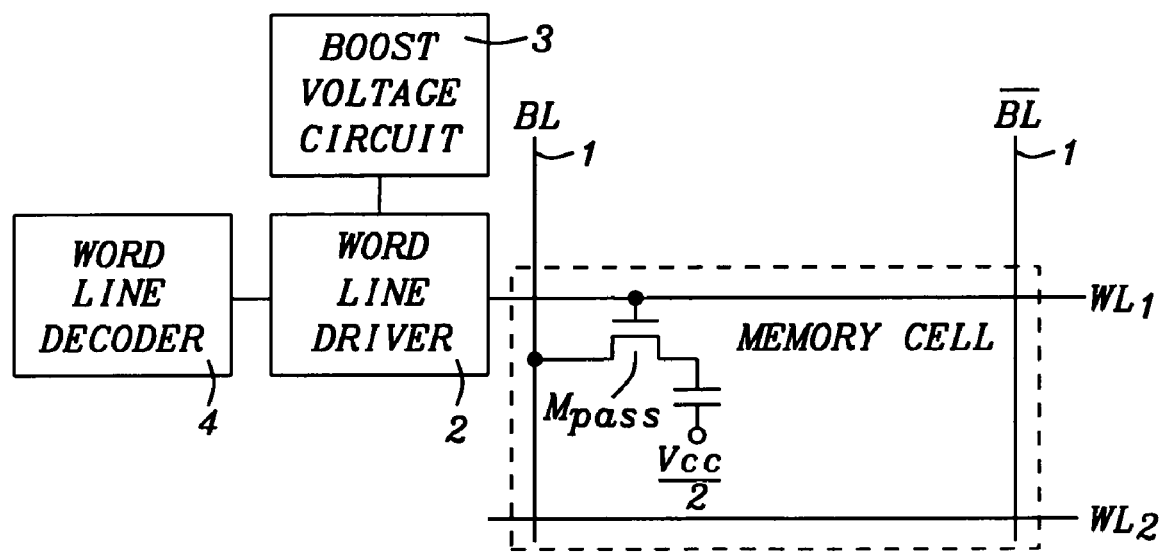
FIG. 1 shows a schematic diagram of a DRAM cell including a word-line driver, a boost voltage circuit to boost the voltage of the word-lines, and a word-line decoder.

FIG. 1 shows a schematic diagram of a DRAM cell comprising two bit lines 1, two word-lines $WL_1$ and $WL_2$, a pass transistor $M_{pass}$ as switching element and a capacitor C used as storage element. Furthermore FIG. 1 prior art shows a word-line driver 2, a boost voltage circuit 3, and a word-line decoder 4. The boost voltage circuit provides a voltage, which is at least one threshold voltage Vth of the pass transistor $M_{pass}$ higher than the power supply voltage source $V_{DD}$.

As the deep sub-micrometer process (0.18 μm-0.13 μm feature size) is becoming more prevalent for fabricating integrated circuits such as DRAM, the operating voltage $V_{DD}$ needs to be reduced. The efficiency of boost voltage circuits, such as e.g. charge pumps, required to boost the voltage of the word-lines follows the equation:

$$Efficiency_{pump} = \frac{2xV_{DD} - V_{PP}}{V_{PP}}, \quad (1)$$

wherein $V_{DD}$ is the power supply voltage of the DRAM system and $V_{PP}$ is the output voltage of the boost voltage circuit 3. Equation (1) shows that the efficiency of a charge pump will be reduced as the operating voltage $V_{DD}$ is reduced.

In former DRAM memory systems an operating voltage $V_{DD}$ of e.g. 2.5 Volts and a boosted voltage $V_{PP}$ of e.g. 3.6 Volts were commonly used. According to equation (1) an efficiency of the charge pump used of around 40% could be then achieved. In current generation DRAM systems using deep sub-micrometer processes, an operating voltage $V_{DD}$ of e.g. 1.8 Volts and a boosted voltage $V_{PP}$ of e.g. 2.9 Volts are commonly used. According to equation (1) the efficiency of the charge pump used drops then to about 25% only. In other words 1 mA of current having $V_{PP}$ voltage requires 4 mA of current of $V_{DD}$ voltage. This leads to an increased power consumption of the power supply of the DRAM system.

Key of the present invention is to boost the voltage $V_{PP}$ required by the local word-lines in multiple stages, or in other words to use multiple power supplies to boost the voltage to the $V_{PP}$ voltage level required by the word-lines.

Figure 2:
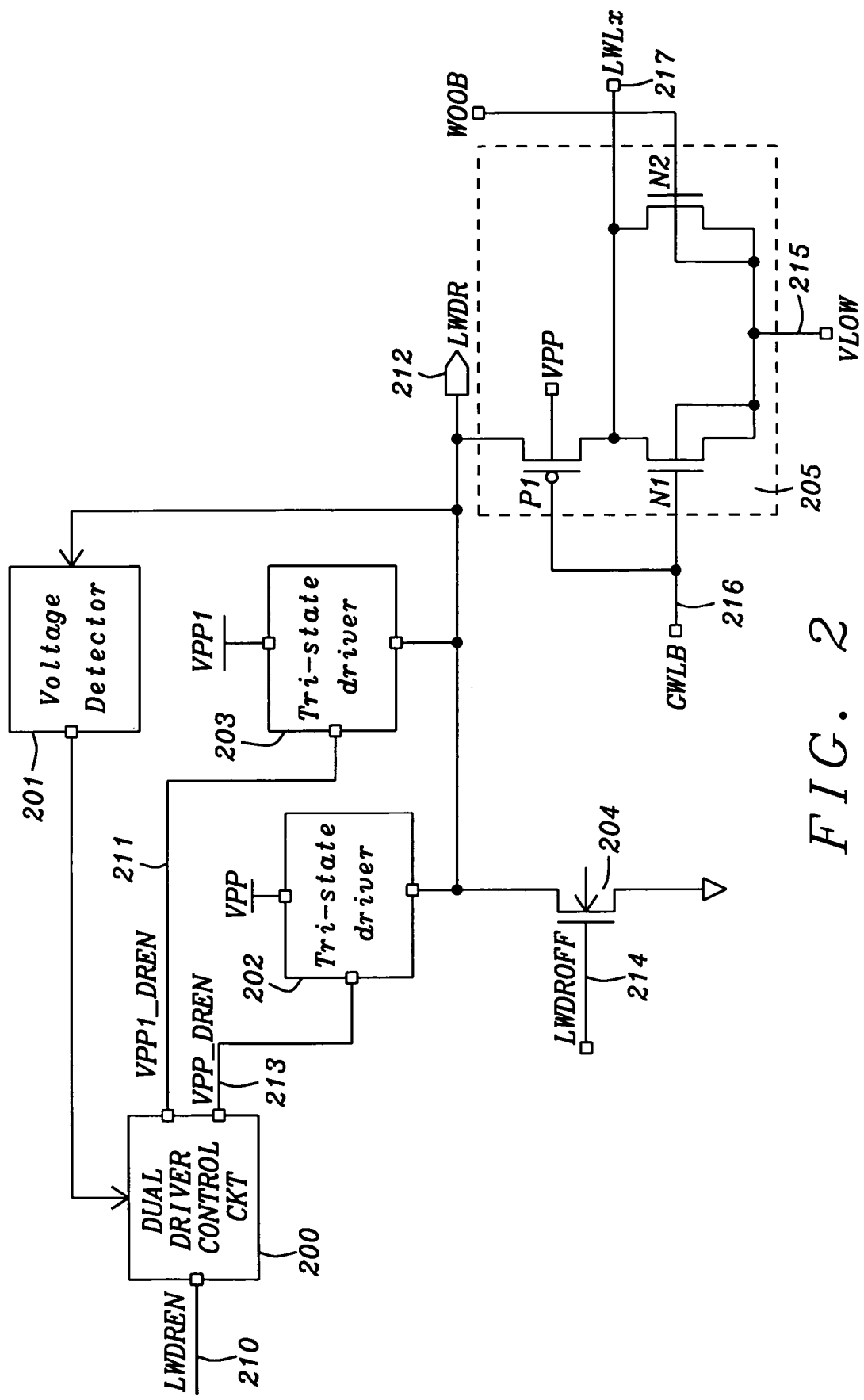
FIG. 2 shows a schematic block diagram of a boost voltage circuit having two stages.

FIG. 2 shows a schematic block diagram of a preferred embodiment of the present invention. The block diagram shows in more detail a word-line driver 2 and a boost voltage circuit 3 as shown in FIG. 1. The voltage $V_{PP}$ required by the local word-lines is generated in two stages by two power supplies. An additional voltage level $V_{PP1}$ is introduced wherein in a preferred embodiment $V_{PP} > V_{PP1} \geq V_{DD}$. The voltage level $V_{PP1}$ is preferably variable between $V_{DD}$ and $V_{PP}$.

The system shown in FIG. 2 comprises a "dual driver control circuit" 200 controlling the build-up of the voltage level VPP which is performed in two stages, The first stage comprises the build-up of the voltage level VPP1 which is performed by a first charge pump in the preferred embodiment described. The "dual driver control circuit" 200 is initiated by a signal LWDREN 210 enabling the local word-line driver. The output of the "dual driver control circuit" 200 comprises two exclusive enablement signals, a first enablement signal VPP1_DREN 211 to activate the VPP1 voltage level generated by a boost converter on the local word-line driver LWDR 212 and a second enablement signal VPP_DREN 213 to activate the VPP voltage level generated by a second boost converter on the local word-line driver LWDR 212. Furthermore the "dual driver control circuit" 200 receives input from a voltage detector 201 monitoring the voltage level on the local word-line driver LWDR 212. This voltage detector circuit 201 exists for each local word-line driver. Once the voltage level VPP1 is reached on the local word-line driver LWDR the voltage detector circuit 201 signals this event to the "dual driver control circuit" 200. The "dual driver control circuit" 200 is then turning off the enablement signal VPP1_DREN and turning on the enablement signal VPP_DREN. The preferred embodiment comprises two standard charge pumps (not shown in FIG. 2). A first charge pump generates the voltage level VPP1 and a second charge pump generates the voltage level VPP. Other types of voltage boost converters could be used as well.

For the voltage detector 201 any kind of circuit which can accurately sense the desired voltage, e.g. a Schmift-trigger or a comparator together with a zener-diode for a reference voltage, can be used.

It has to be understood that alternatively three or more than stages could be used as well. In case of generating a voltage VPP in three stages another intermediate voltage VPP2 has to generated. For this purpose an additional voltage detection circuit and an additional tri-state driver would be required Since is $V_{PP1}$ lower than $V_{PP}$, the pumping efficiency of both charge pumps is higher compared to using one charge pump only.

The block diagram of FIG. 2 shows two tri-state drivers 202 and 203. A tri-state driver outputs either HIGH, LOW or "nothing". In the preferred embodiment shown in FIG. 2 either tri-state driver 202 puts voltage level $V_{pp}$ on the local word-line driver LWDR 212 or tri-state driver 203 puts voltage Vpp1 on the local word-line driver LWDR 212. The enablement signals VPP1_DREN 211 initiates tri-state driver 203 and the enablement signals VPP_DREN 213 initiates tri-state driver 202. Both tri-state drivers connect to the local word-line driver LWDR 212—but the exclusive enablement signals VPP1_DREN and VPP_DREN ensure that only one of tri-state drivers is driving a voltage level at any one time. When the output of a tri-state driver is high, the local word-line driver LWDR 212 is driven to the corresponding voltage level, otherwise this driver outputs only a high-impedance signal and hence can be over-ridden by any other driven value.

Alternatively other switching means as e.g. multiplexers could be used instead of the tri-state drivers 202 and 203.

A transistor 204 used as a switch, receiving a signal LWDROFF, can deactivate the local word line driver LWDR 212.

The transistor configuration 205 shows a preferred embodiment of the word-line driver 2 shown in FIG. 1. It covers e.g. an array of 256 or 512 memory cells. The word-line driver 205 is composed of the MOS transistors P1 and N1. The source of PMOS transistor P1 is connected to the local word-line driver LWDR 212. If the signal GWLB 216 (Global word line bar enable) at the gate electrode of the PMOS transistor P1 is a logical 0, the voltage at the gate electrode of PMOS transistor P1 approaches that of the ground reference point $V_{LOW}$. Likewise, if the local word-line driver LWDR 212 is charged to the boost voltage $V_{PP}$ and the signal at the gate electrode of NMOS transistor N1 is the logical 0, the voltage at the gate electrode of N1 approaches that of the ground reference point $V_{LOW}$. Transistor N2 is used for local word line reset for DRAM array precharge The line connected with the drains of transistors N1 and N2 is a local word line LWLx 217 wherein x is any local word line number. The line connected with the sources of transistors N1 and N2 is a correspondent local word line reset bar enable line WxxB 218.

Figure 3:
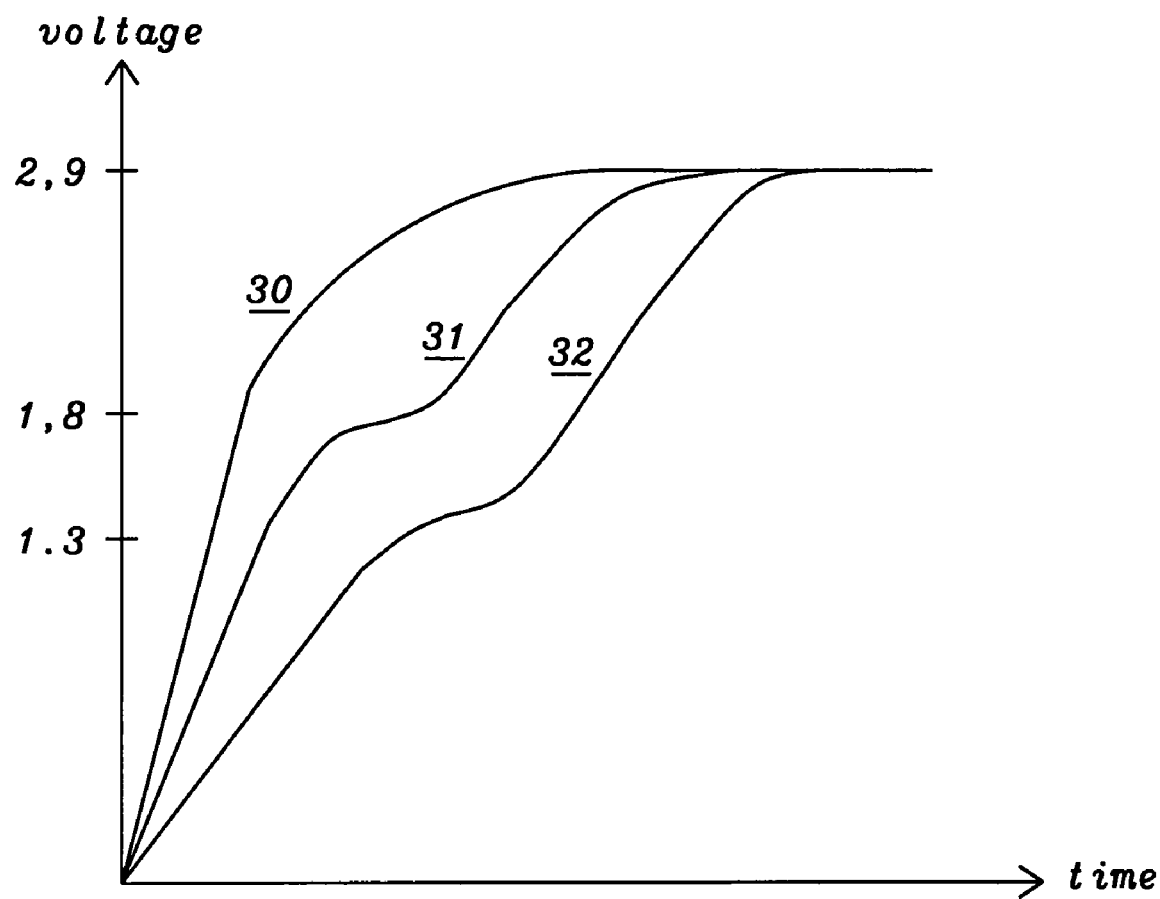
FIG. 3 illustrates time diagrams of various cases to build-up the boosted voltage VPP required to drive a local word-line driver. Two cases show the impact of building-up the boosted voltage VPP in two stages.

The time diagrams of FIG. 3 illustrate examples of various cases to build-up the boosted voltage $V_{PP}$ required to drive a local word-line driver LWDR 212 as shown in FIG. 2 The charge of a capacitor C of a memory cell, as shown in FIG. 1, follows the equation $$Q = C \times V,  \quad (2)$$

wherein Q is the charge of the capacitor, C is the capacitance and V is the voltage on the capacitor.

The power consumption depends upon the voltage V on the capacitor, upon the capacitance C and on the pumping efficiency as shown in equation (1). The three curves 30, 31, and 32, all based on a $V_{DD}$ voltage of 1.8 Volts, show the build-up of $V_{PP}$ on a local word-line driver LWDR 212 as shown in FIG. 2. The curves 30, 31, and 32 correspond to a $V_{PP}$ voltage level of 2.9 Volts. Curve 30 shows the build up of voltage level $V_{PP}$ using one charge pump only. Using one charge pump the power consumption Pc corresponds to the equation:

$$Pc = \frac{voltage}{pumpeff} \times C = \frac{VPP}{pumpeff} \times C = \frac{2.9 \text{ V}}{25\%} \times C = 11.6C.$$

Curve 31 shows the build-up of voltage level $V_{PP}$ using two stages. The first stage is a voltage build-up to a $V_{PP1}$ voltage of 2.4 Volts having a pumping efficiency of 40% according to equation (1). The second stage is the final build up to $V_{PP}$ of 2.9 having a pumping efficiency of 25% according to equation (1). Therefore the total power consumption Pc of Curve 31 is:

$$Pc = \frac{2.4 \text{ V}}{40\%} \times C + \frac{2.9 \text{ V} - 2.4 \text{ V}}{25\%} \times C = 6C + 2C = 8C.$$

Curve 32 shows the build-up of voltage level $V_{PP}$ using two stages again. The first stage is a voltage build-up to a $V_{PP1}$ voltage of 1.3 Volts having a pumping efficiency of 100% according to equation (1). The second stage is the final build up to $V_{PP}$ of 2.9 having a pumping efficiency of 25% according to equation (1). Therefore the total power consumption Pc of Curve 32 is:

$$Pc = \frac{1.3 \text{ V}}{100\%} \times C + \frac{2.9 \text{ V} - 1.3 \text{ V}}{25\%} \times C = 1.3C + 6.4C = 7.7C.$$

Curve 30 shows the best performance but also the highest power consumption of 11.6 C. Curve 32 shows the lowest power consumption of 7.7 C but the slowest performance as well. Curve 31, based on an adequate $V_{PP1}$ voltage, provides the best compromise between power consumption (8C) and performance. In addition, when $V_{PP1}$ voltage is higher than $V_{DD}$ voltage the local word-line driver LWDR will have a better RC behaviour.

It has to be understood that the present invention can be used beyond DRAM word-line drivers for a multitude of other applications requiring boosted voltages in order to reduce power consumption.

Figure 4:
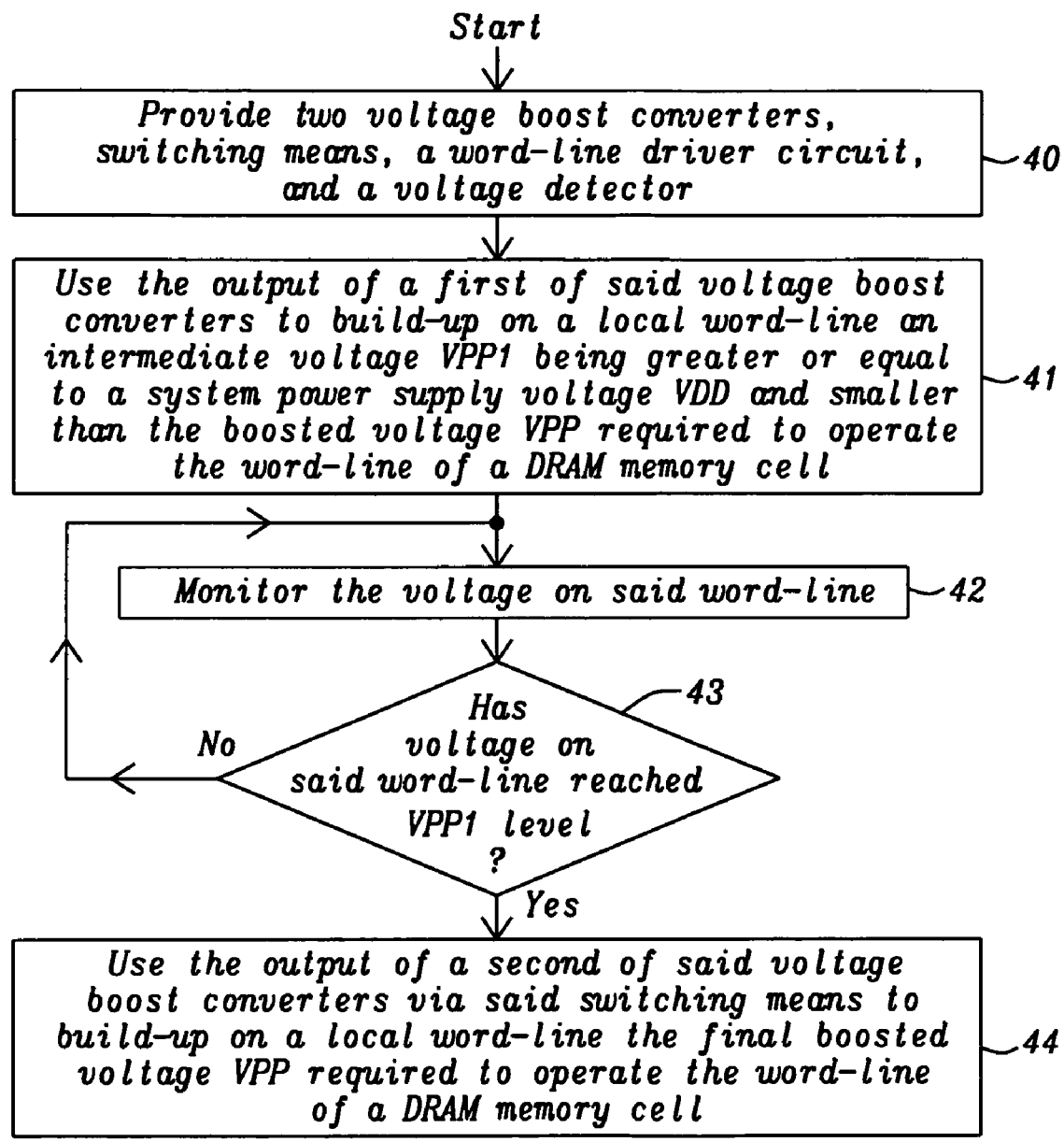
FIG. 4 shows a flowchart of a method to reduce power consumption of local DRAM word-line drivers.

FIG. 4 illustrates a flowchart of a method to reduce power consumption of local DRAM word-line drivers. Step 40 illustrates the provision of two voltage boost converters, switching means, a local word-line driver circuit, and a voltage detector. It has to be understood that more than two stages are possible. For each additional stage is one additional boost converter and one additional voltage detector required. In a preferred embodiment two boost converters are used. Step 41 describes the usage of the output of a first voltage boost converter to build-up on a local word-line driver an intermediate voltage $V_{PP1}$ being smaller than the boosted voltage $V_{PP}$ required to operate a local word-line driver of a DRAM memory cell array. A good compromise between power consumption and performance can be achieved if $V_{PP1}$ is equal or higher the system power supply voltage $V_{DD}$. In step 42 said the voltage on said local word-line driver is monitored and in step 43 is a check if the voltage on said local word-line driver has reached $V_{PP1}$ level. In case $V_{PP1}$ voltage level has not been reached yet the process flow goes back to step 42, otherwise the process flow continues with step 44. In case the $V_{PP1}$ voltage has been reached the output of a second voltage boost converter is used via said switching means to build-up on a local word-line driver the final boosted voltage $V_{PP}$ required to operate a word-line of DRAM memory cell array.

While the invention has been particularly shown and described with reference to the preferred embodiments thereof, it will be understood by those skilled in the art that various changes in form and details may be made without departing from the spirit and scope of the invention.

What is claimed is:

1. A method to reduce power consumption of a local DRAM word-line driver by building up in n stages a voltage VPP required, comprises:
   (1) provide n voltage boost converters, n switching means, a local word-line driver circuit, and (n–1) voltage detectors;
   (2) monitor the voltage on said local word-line driver;
   (3) use exclusively the output of a first of said voltage boost converters to build-up on a local word-line driver a first intermediate voltage VPP1 being smaller than the boosted voltage VPP required to operate the word-line of a DRAM memory cell array until said intermediate voltage VPP1 is reached;
   (4) use exclusively the output of a next of said n voltage boost converters to build-up on a local word-line driver a next voltage level assigned to the boost converter in operation, wherein said voltage is higher than the previous voltage level until said voltage level assigned is reached;
   (5) check if n-th voltage booster converter is in use and if negative, go to step (4), otherwise go to end.

2. The method of claim 1 wherein said n voltage boost converters are charge pumps.

3. The method of claim 1 wherein said switching means are n tri-state circuits.

4. The method of claim 1 wherein said switching means is a multiplexer.

5. The method of claim 1 wherein said intermediate voltage VPP1 is equal or higher than the system power supply voltage VDD and is smaller than the boosted voltage VPP required to operate the word-line of a DRAM memory cell.

6. The method of claim 1 wherein n equals two and two boost converters and two voltage detectors are used.

7. A circuit to provide a boosted voltage for a local word-line driver of a DRAM cell array is comprising:

a local word-line of a DRAM cell array;

two voltage boost converters being connected to a first switching means, wherein a first converter provides a voltage level VPP required to operate said local word-line of a DRAM cell array and a second boost converter provides a voltage level VPP1 which is lower than voltage level VPP;

a control circuit having inputs and outputs wherein its inputs are a signal to enable said local word-line driver and a signal from a voltage detector indicating if the voltage level of said local word-line driver has reached said VPP1 voltage level and its output are two exclusive signals enabling said first switching means to put either said VPP1 voltage or said VPP voltage on said word-line;

said voltage detector monitoring the voltage level of said local word-line driver and indicating to said control circuit when said VPPI voltage level is reached;

said first switching means which is controlled by said control circuit pulling either said VPP voltage or said VPP1 voltage on said word-line; and a second switching means used to disable said local word-line driver by connecting the word-line to a ground voltage level.

8. The circuit of claim 7 wherein said voltage boost converters are charge pumps.

9. The circuit of claim 7 wherein said first switching means are two tn-state drivers, wherein a first tn-state driver switches said VPP voltage on said word-line if enabled by said control circuit and a second tn-state driver switches said VPP1 voltage on said word-line if enabled by said control circuit.

10. The circuit of claim 7 wherein said second switching means is a transistor.

11. The circuit of claim 7 wherein said voltage detector is a Schmitt-trigger.

12. The circuit of claim 7 wherein said voltage detector is a comparator.

* * * * *